(12) United States Patent
Sahinoglu et al.

(10) Patent No.: US 8,972,215 B2
(45) Date of Patent: Mar. 3, 2015

(54) METHOD AND SYSTEM FOR DETERMINING PARAMETERS OF SINUSOIDAL SIGNALS

(75) Inventors: Zafer Sahinoglu, Boston, MA (US); Ming Sun, Sunnyvale, CA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 833 days.

(21) Appl. No.: 13/075,558

(22) Filed: Mar. 30, 2011

(65) Prior Publication Data

US 2012/0253742 A1 Oct. 4, 2012

(51) Int. Cl.
| | |
|---|---|
| *G01R 23/02* | (2006.01) |
| *G01R 25/00* | (2006.01) |
| *H02J 13/00* | (2006.01) |
| *G06F 19/00* | (2011.01) |
| *G06F 17/40* | (2006.01) |
| *G01R 23/15* | (2006.01) |
| *G01R 19/25* | (2006.01) |

(52) U.S. Cl.
CPC ................ *G01R 23/15* (2013.01); *G01R 23/02* (2013.01); *H02J 13/00* (2013.01); *G06F 17/40* (2013.01); *G06F 19/00* (2013.01); *G01R 19/2513* (2013.01); *G01R 25/00* (2013.01)
USPC .............. 702/75; 73/865.8; 324/66; 702/189; 708/200

(58) Field of Classification Search
CPC ........... G01D 7/00; G01D 9/00; G01D 21/00; G01R 13/00; G01R 13/02; G01R 19/00; G01R 19/25; G01R 19/2513; G01R 23/00; G01R 23/02; G01R 25/00; G01R 29/00; G01R 29/18; G06F 11/00; G06F 11/30; G06F 11/32; G06F 11/34; G06F 17/00; G06F 17/40; G06F 19/00; H02J 13/00; H02J 13/0006; H02J 13/0093; H03L 7/00
USPC .......... 73/432.1, 865.8, 865.9, 866.3; 324/66, 324/76.11, 76.39, 76.77, 86, 107, 500, 512, 324/520, 521, 522, 537, 538, 543; 340/500, 340/540, 657, 658; 702/1, 57, 66, 75, 127, 702/179, 187, 189; 708/100, 105, 200
See application file for complete search history.

(56) References Cited

U.S. PATENT DOCUMENTS

| | | | | |
|---|---|---|---|---|
| 4,199,798 | A * | 4/1980 | Leppke et al. | 361/76 |
| 7,305,025 | B2 * | 12/2007 | Yamaguchi et al. | 375/226 |
| 7,548,819 | B2 * | 6/2009 | Slothers et al. | 702/57 |
| 2005/0192765 | A1* | 9/2005 | Slothers et al. | 702/57 |
| 2005/0267696 | A1* | 12/2005 | Yamaguchi et al. | 702/57 |

FOREIGN PATENT DOCUMENTS

JP 2012-211896 A * 11/2012

* cited by examiner

*Primary Examiner* — Edward Cosimano
(74) *Attorney, Agent, or Firm* — Dirk Brinkman; Gene Vinokur

(57) ABSTRACT

At least one parameter of a signal is determined, wherein the signal is a sinusoidal signal including noise, wherein the parameter includes at least one of a frequency of the signal, and an angle of a phase of the signal. The frequency of the signal is determined iteratively based on a linear relationship among the frequency of the signal, samples of the noise, and samples of the signal using a statistical correlation among the samples of the noise. During a current iteration the statistical correlation is updated based on the frequency of the signal determined during a previous iteration, and the samples of the signal are updated with values of the signal during a current period of time.

20 Claims, 6 Drawing Sheets

METHOD AND SYSTEM FOR DETERMINING PARAMETERS OF SINUSOIDAL SIGNALS

FIELD OF THE INVENTION

This invention relates generally to power grids, and in particular to a system and a method for determining parameters of sinusoidal signal generated by the power grid.

BACKGROUND OF THE INVENTION

Synchronization in a utility power grid is a critical issue for the purpose of control and operation when distributed power generators are connected to the grid. The synchronization includes determining a phase angle of 3-phase voltage signals in the grid. Usually, the grid voltage signal deviates from the ideal condition and is distorted due to additive noise, frequency variation, voltage unbalance, and harmonic components. As a result, it is desired to provide synchronization that minimizes such distortions. Similarly, fast detection of the frequency and the phase angle of the voltage signal are critical for reconnecting, or disconnecting distributed generators to manage power demand.

The unbalanced 3-phase voltage signal includes a positive, a negative and a zero phase sequences. Usually, the synchronization requires detecting the phase angle of the positive sequence of the voltage signal. A number of conventional methods for detecting the phase angle were developed.

A zero-crossing method is a simplest technique. However, that method is sensitive to the disturbances of the voltage signal. Also, the phase angle is determined only at zero-crossing points, and, hence, that method has low dynamic performance.

A phase locked loop (PLL) method can be used with a synchronous rotating reference frame. However, performance of the PLL method degrades in the presence of voltage unbalance because a double frequency component is introduced due to the existence of the negative phase sequence.

Several methods have been developed to handle the unbalance based on the separation of the positive and negative sequences through the application of symmetrical component transformation. Another method uses a fixed weight vector to estimate the frequency and phase angle of the voltage signal. However, that method is not adaptive. The weights are selected heuristically, and therefore, in some situations the method performs inaccurately.

SUMMARY OF THE INVENTION

It is an object of an invention to provide a method for determining at least one parameter of a sinusoidal signal. The sinusoidal signal may include three interrelated sinusoidal signals, e.g., three-phase voltage signal or a three-phase current signal. The parameter may include, at an instant in time, at least a frequency of the signal, and an angle of a phase of the signal, and amplitude of the signal.

It is further object of the invention to provide such a method that determines the parameter of the signal in a presence of noise, such as additive noise.

It is further object of the invention to provide such a method that determines the parameter of the signal iteratively over time, such that a current iteration uses the parameter determined during a previous iteration. The iterative determination of some embodiments of the invention enables to reduce effect of the additive noise.

Some embodiments of the invention are based on a realization that there is a linear relationship among the frequency of the signal, samples of the noise, and samples of the signal. Also, there is a statistical correlation among the samples of the noise that enables determining the frequency of the signal based on the liner relationship.

One embodiment provides a method for synchronizing and determining a phase angle of a three-phase voltage signal in a power grid in the presence of a voltage unbalance. The embodiment considers both the amplitude and the phase unbalance of the signal.

Some embodiments, instead of processing the three-phase voltage signal in a natural reference frame, separate the signal in a positive sequence and a negative sequence by applying a Clarke transformation. Next, optimum weights of a noise covariance matrix are determined using the statistical correlation among the samples of noise. The optimum weights are used to determine the frequency and the angle of the phase of the signal via weighted least squares method.

Accordingly, one embodiment of the invention discloses a method for determining at least one parameter of a signal, wherein the signal is a sinusoidal signal including noise, wherein the parameter includes at least one of a frequency of the signal at an instant of time, and an angle of a phase of the signal at the instant of time. The method includes determining iteratively the frequency of the signal based on a linear relationship among the frequency of the signal, samples of the noise, and samples of the signal using a statistical correlation among the samples of the noise, wherein a current iteration includes: updating the statistical correlation based on the frequency of the signal determined during a previous iteration; and updating the samples of the signal with values of the signal during a current period of time. The angle of the phase of the signal may be determined based on the frequency of the signal.

The method may also include one or combination of initializing the statistical correlation based on a fundamental frequency of the signal, determining a weight matrix using the statistical correlation, subjecting the signal to a discrete oscillator operation to produce the samples of the signal, transforming the signal to a Clarke reference domain using a Clarke transformation.

In various embodiments the linear relationship is defined based on an error due to the noise, a noise vector, a frequency matrix, a first term vector, a second term vector, wherein elements of the first term vector and the second term vector are functions of the samples of the signal.

Iterations of the method may be performed for a period of time. Some periods of time may be overlapping. Additionally or alternatively, a current period of time for a current iteration may be adjacent to a previous period of time for a previous iteration.

Another embodiment discloses a system for determining at least one parameter of a signal, wherein the signal is a three-phase voltage signal including noise, wherein the parameter includes at least one of a frequency of the signal at an instant of time, and an angle of a phase of the signal at the instant of time. The system includes a discrete oscillator for determining samples of the signal for each period of time; and a processor for determining iteratively, for each period of time, the frequency of the signal based on a linear relationship among the frequency of the signal, the noise, and the samples of the signal, wherein the processor during a current iteration updates a noise covariance matrix based on the frequency of the signal determined during a previous iteration; updates the samples of the signal with values of the signal during a current period of time; and determines the frequency using the noise covariance matrix and the samples of the signal.

The processor may be also configured to determine the angle of the phase of the signal based on the frequency of the signal, and to update the noise covariance matrix using a weighted least square method.

DETAILED DESCRIPTION OF THE PREFERRED EMBODIMENTS

Figure 1:
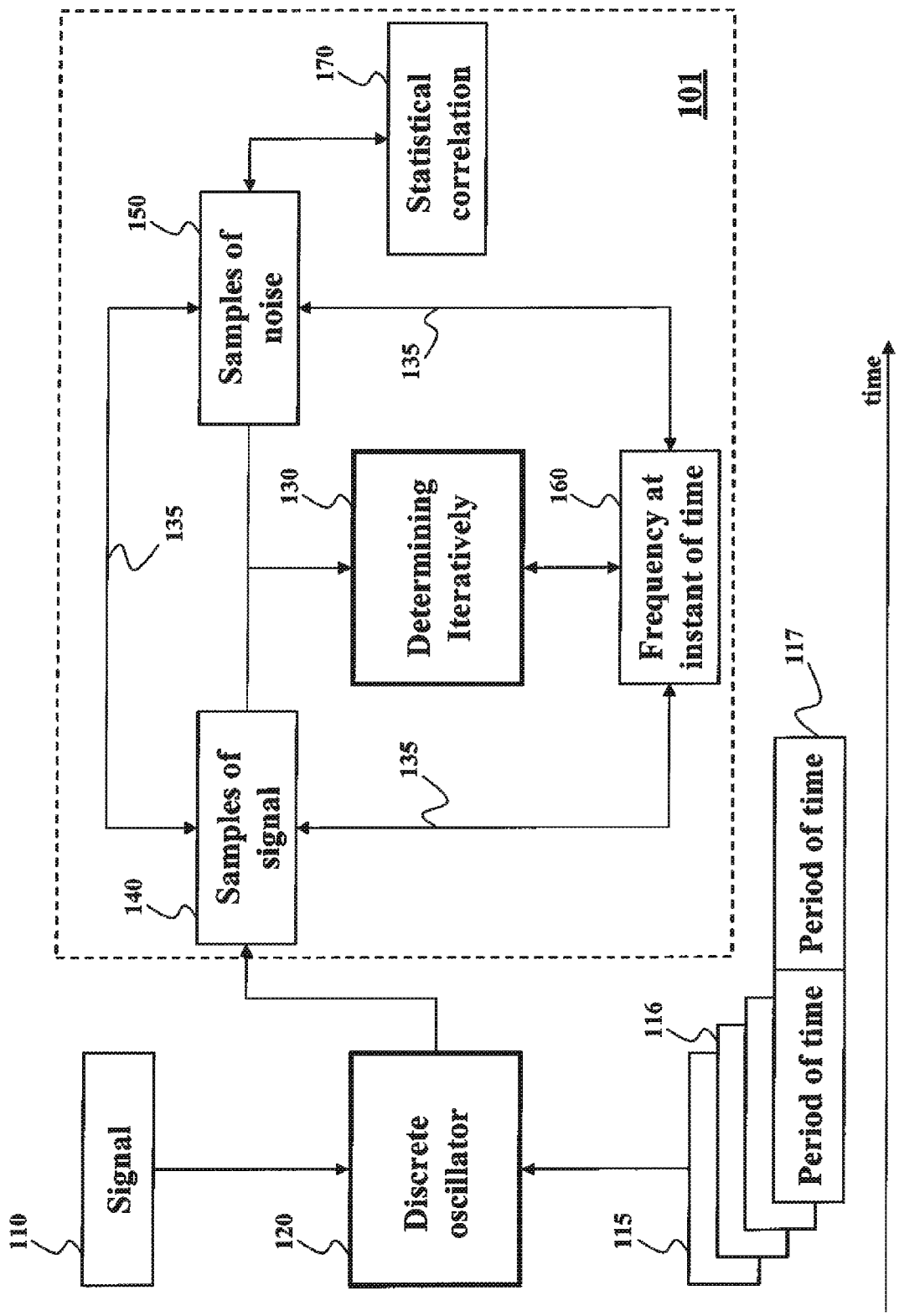
FIG. 1 is a block diagram of a system according to some embodiments of an invention.

FIG. 1 shows a system for determining at least one parameter of a signal 110. The signal is a voltage signal including noise. The parameter includes at least one of a frequency of the signal at an instant of time, and an angle of a phase of the signal at the instant of time. The system includes a discrete oscillator 120 for determining samples 140 of the signal 110 for each period of time 115-117. In some embodiments, the discrete oscillator 120 can be any numerically-controlled oscillator configured to determine a synchronous, i.e., clocked, discrete-time, discrete-valued samples of the signal.

The system also includes a processor 101 for determining iteratively 130, for each period of time, the frequency 160 of the signal 110 based on a linear relationship 135 among the frequency of the signal, samples of noise 150, and the samples of the signal 140. In various embodiments, the determining 130 uses a statistical correlation 170 among the samples of the noise.

The linear relationship is defined according to $\zeta = Bn = h - G\alpha$, wherein $\zeta$ represents an error due to the noise, n is a noise vector, B is a frequency matrix, h is a first term vector, G is a second term vector, $\alpha$ represents an angular frequency $\omega$, $\alpha = \cos\omega$, wherein elements of the first term vector and the second term vector are functions of the samples of the signal. Some solutions of the linear relationship are described below.

The iterations of the determining 130 are performed for periods of time, wherein at least some periods 115-116 of time are overlapping. Additionally or alternatively a current period of time 117 for a current iteration can be adjacent to a previous period of time 116 for a previous iteration.

Figure 2B:
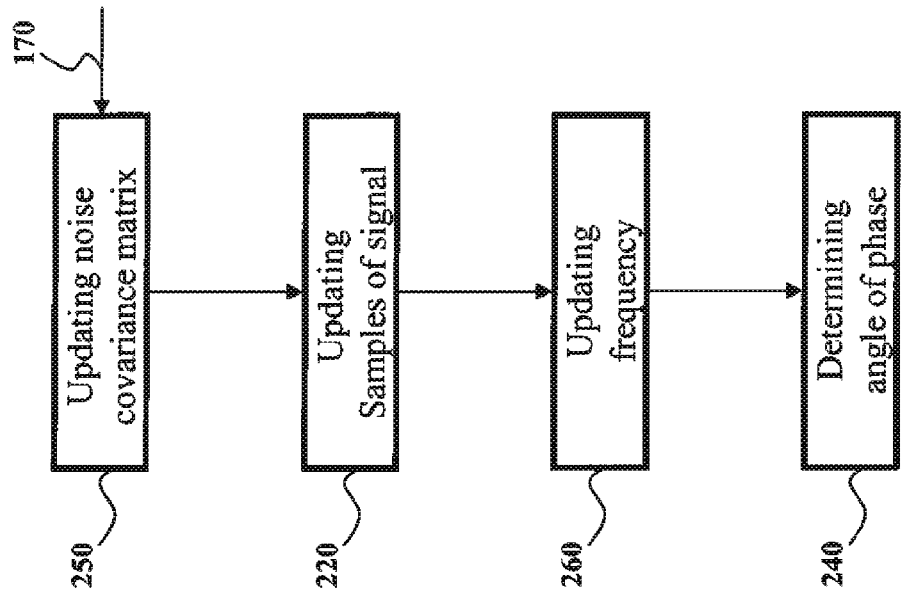
FIGS. 2A and 2B are flow charts of various operations performed by different embodiments of the system of FIG. 1
Figure 2A:
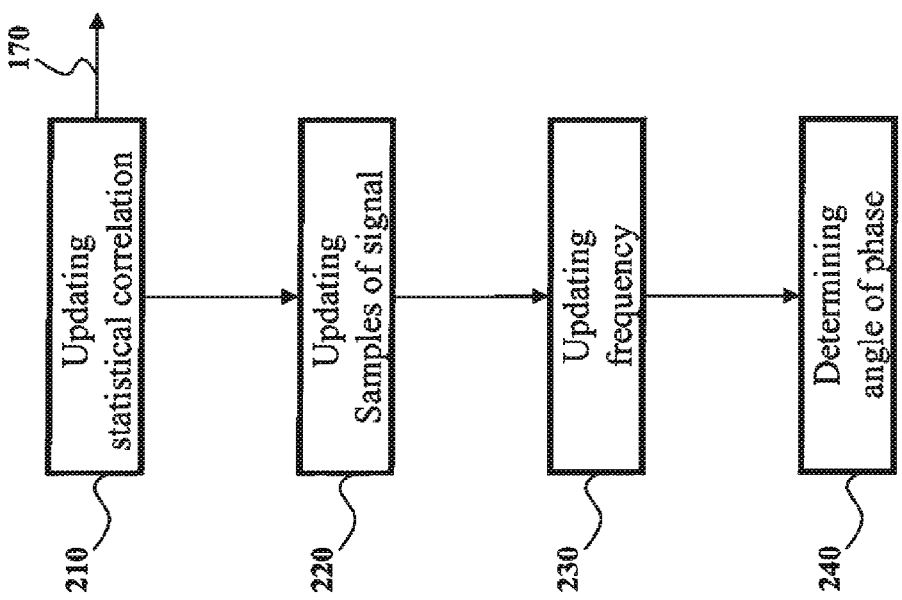

FIGS. 2A and 2B show examples of the iterations according to various embodiments of the invention. For example, a current iteration, according to one embodiment shown in FIG. 2A includes updating 210 the statistical correlation 170 based on the frequency 160 of the signal determined during a previous iteration; and updating 220 the samples 140 of the signal with values of the signal during a current period of time. Based on the updated statistical correlation and the samples, the embodiment updates 230 the frequency 160 using the linear relationship 135.

Another embodiment, shown in FIG. 2B, determines a noise covariance matrix using the statistical correlation 170. This embodiment, for each iteration, updates 250 the noise covariance matrix based on the frequency of the signal determined during a previous iteration; updates 220 the samples of the signal with values of the signal during a current period of time; and updates 260 the frequency using the noise covariance matrix and the samples of the signal.

In some embodiments, for the first iteration, the frequency is a fundamental frequency of the signal. For example, the statistical correlation and/or the noise covariance matrix are initialized based on the nominal frequency. Also, in some embodiment, an angle of the phase of the signal is determined 240 based on the frequency of the signal at an instant of time.

Figure 3:
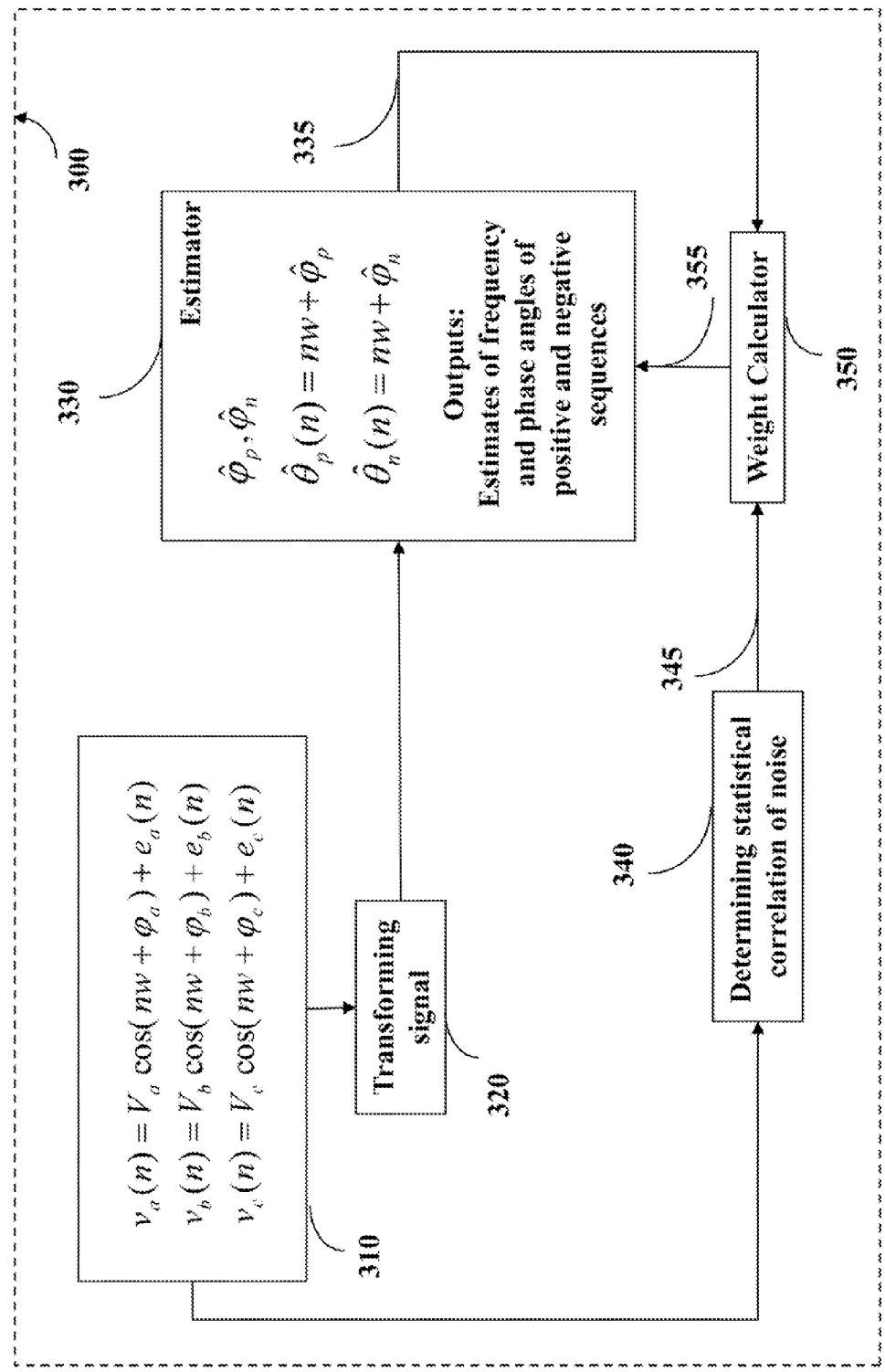
FIG. 3 is a block diagram of a method for determining a frequency and an angle of a phase of three-phase voltage signals in Clarke transform domain by using statistical correlation of noise and adaptive weights according to some embodiments.

FIG. 3 shows a block diagram of a method 300 that can be implemented by a processor for determining a frequency and an angle of a phase 335 of three-phase voltage signals 310 in a Clarke transform domain by using statistical correlation 345 of noise and adaptive weights 355 according to one embodiment of the invention. The signal 310 can be a signal from a utility power grid. The embodiment uses a weighted least squares method 330 for determining iteratively the frequency and the angle.

The 3-phase voltage signals 310 of the power grid can be measured for synchronization of the grid. In the presence of a voltage unbalance, the 3-phase voltage signals 310 is distorted by the additive noise in an abc reference domain are expressed as $v_a(n) = V_a \cos(nw + \phi_a) + e_a(n)$ $v_b(n) = V_b \cos(nw + \phi_b) + e_b(n)$ $v_c(n) = V_c \cos(nw + \phi_c) + c(n)'$  (1)

where n is an instant in time for i=a, b, c, $V_i$ is an amplitude of the signal, and $\phi_i$ is an initial phase angle of the phase i, w is an angular frequency of the signal, $w = 2\pi f/f_s$ where f is the frequency of the signal and $f_s$ is a sampling frequency, and e is additive noise.

The additive noise at the instant of time n is $e(n) = [e_a(n), e_b(n), e_c(n)]^T$, where T is a transpose operator, e.g., a transpose operator 400. In some embodiments, the noise includes a zero-mean Gaussian random vector with covariance matrix Q. In some embodiments, the noise vectors at different instants of time are uncorrelated.

According to Fortescue's theorem, the 3-phase voltage signal 310 can be rewritten as $v(n) = v_p(n) + v_n(n) + v_0(n) + e(n)$, where $v_p(n)$, $v_n(n)$ and $v_0(n)$ represent a positive sequence p, a negative sequence n, and a zero sequence 0 respectively defined by $$V_p(n) = V_p\left[\cos\theta_p(n), \cos\left(\theta_p(n) - \frac{2\pi}{3}\right), \cos\left(\theta_p(n) + \frac{2\pi}{3}\right)\right]^T \quad (2)$$

$$V_n(n) = V_n\left[\cos\theta_n(n), \cos\left(\theta_n(n) + \frac{2\pi}{3}\right), \cos\left(\theta_n(n) - \frac{2\pi}{3}\right)\right]^T$$

$$V_0(n) = V_0[\cos\theta_0(n), \cos\theta_0(n), \cos\theta_0(n)]^T,$$

where $V_i$ and $\theta_i(n)$ for i=p, n, 0 are the amplitude and the angle of phase of each sequence, respectively.

According to one embodiment of the invention, an estimate 330 of the angle $\theta_p(n)$ is obtained by the following steps:

a. transforming 320 the 3-phase voltage signals 310 to $\alpha\beta$-reference signal 325 in a Clarke reference domain using, e.g., a Clark transformation matrix 400; Obtaining statistical correlation characteristics 340 from nominal operation conditions and determining the noise covariance matrix 345; determining parameters of the signal and corresponding quadrature signals of the $\alpha\beta$-reference signal using the weighted least squares method, which uses iteratively the weights 355 returned by the weight calculator 350; and b. determining a phase angle of a positive sequence based on a relationship of the phase angle to other parameters of the signal.

Clark Transformation

Figure 4:
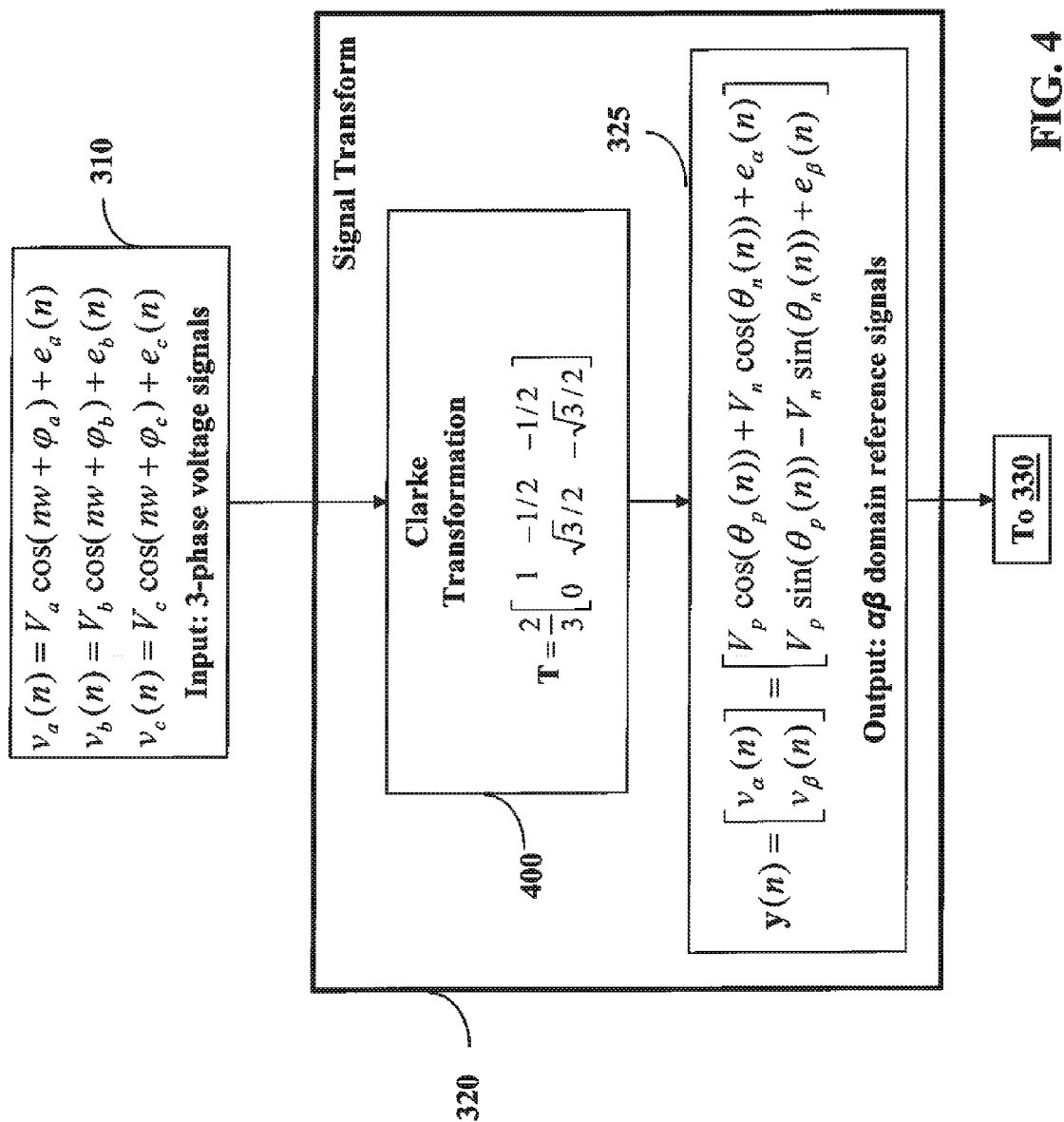
FIG. 4 is a block diagram of a Clarke transformation according to some embodiments.

As shown in FIG. 4, after applying the Clarke transformation 320 to the signal defines according to Equation (1), the corresponding signal 325 in $\alpha\beta$-reference domain is $$[v_\alpha(n), v_\beta(n)]^T = T[v_a(n), v_b(n), v_c(n)]^T, \quad (3)$$

where $$T = \frac{2}{3}\begin{bmatrix} 1 & -\frac{1}{2} & -\frac{1}{2} \\ 0 & \frac{\sqrt{3}}{2} & -\frac{\sqrt{3}}{2} \end{bmatrix}$$

is the Clarke transformation matrix 400.

The resulting $\alpha\beta$-reference frame signal 325 can then be represented by $$y(n) = \begin{bmatrix} v_\alpha(n) \\ v_\beta(n) \end{bmatrix} = V_p \begin{bmatrix} \cos\theta_p(n) \\ \sin\theta_p(n) \end{bmatrix} + V_n \begin{bmatrix} \cos\theta_n(n) \\ -\sin\theta_n(n) \end{bmatrix} + \begin{bmatrix} e_\alpha(n) \\ e_\beta(n) \end{bmatrix}. \quad (4)$$

The covariance of the noise vector $e_{\alpha\beta}(n) = [e_\alpha(n), e_\beta(n)]^T$ is denoted as $Q_{\alpha\beta} = TQT^T$.

Some embodiments apply the Clarke transformation to cancel the zero sequence, and to reduce the number of unknown parameters by two. Although the number of unknown parameters in Equation (4) is reduced, Equation (4) still includes parameters of two sinusoidal signals, i.e., the positive and the negative sequences, and is non-linear with respect to the unknown parameters.

However, the positive and the negative sequences have the same frequency, and the signal 325 can be defined according to $$\begin{aligned} v_\alpha(n) &= (V_p \cos\varphi_p + V_n \cos\varphi_n)\cos(nw) - \\ &\quad (V_p \sin\varphi_p + V_n \sin\varphi_n)\sin(nw) + e_\alpha(n) \\ &= V_\alpha \cos(nw + \varphi_\alpha) + e_\alpha(n) \\ v_\beta(n) &= (V_p \sin\varphi_p - V_n \sin\varphi_n)\cos(nw) - \\ &\quad (-V_p \cos\varphi_p + V_n \cos\varphi_n)\sin(nw) + e_\beta(n) \\ &= V_\beta \cos(nw + \varphi_\beta) + e_\beta(n) \end{aligned} \quad (5)$$

It can be seen from Equation (5) that each phase in the $\alpha\beta$ domain includes only one sinusoidal signal distorted with noise. The problem becomes estimating parameters of a single-tone sinusoidal signal. After the parameters and $V_i$ for $\varphi_i$ for $i=\alpha,\beta$ are determined from signals $v_\alpha(n)$ and $v_\beta(n)$, and the phase angle $\theta_p(n)$ can be determined based on Equation (5).

Weighted Least Squares Method

In some embodiments, the frequency of the signal is extracted based on the discrete oscillator and determined iteratively using weighted least square (WLS) method. For example, one embodiment uses the statistical correlations 345 of the samples of noise, and updates, for each iteration, the noise covariance matrix 355, which improves the performance of frequency estimation. Specifically, according to the discrete oscillator, for the sinusoidal signal $v(n)=V\cos(n\omega+\phi)$ with unknown frequency $\omega$, amplitude V, and initial phase $\phi$, the following relationship between $\omega$ and the consecutive triple $v(n)$, $v(n-1)$ and $v(n-2)$ is valid, $$v(n) = 2v(n-1)\cos\omega - v(n-2). \quad (6)$$

Given the three samples of the signal, the frequency of the signal can be determined according to $$\omega = \cos^{-1}\left(\frac{v(n)+v(n-2)}{2v(n-1)}\right). \quad (7)$$

However, the Equation (7) fails when the sinusoidal signal includes noise. Also, there is a numerical ill-conditioning when the denominator is very close to zero. However, Applicants are recognized the statistical correlation of the noise component of the signal enables to overcome the aforementioned problems.

Because both the parameters, e.g., the amplitudes and the frequency, of the signal of Equation (5) are unknown and vary slowly over time, some embodiments consider the parameters as piecewise constant over certain number of samples. For example n=0, 1, ..., N-1 and N is larger than three.

Therefore, the discrete oscillator can be applied to the third and the sixth lines of Equation (5) with the noise terms taken into account according to $$\zeta_\alpha(n) = v_\alpha(n) + v_\alpha(n-2) - 2\alpha v_\alpha(n-1) \quad (8a)$$

$$\zeta_\beta(n) = v_\beta(n) + v_\beta(n-2) - 2\alpha v_\beta(n-1) \quad (8b)$$

where the noise terms $\zeta_-(n)$ and $\zeta_-(n)$ are given as $$\zeta_\alpha(n) = e_\alpha(n) + e_\alpha(n-2) - 2\alpha e_\alpha(n-1) \quad (9a)$$

$$\zeta_\beta(n) = e_\beta(n) + e_\beta(n-2) - 2\alpha e_\beta(n-1) \quad (9b)$$

The angular frequency $\omega$ is contained in $\alpha = \cos\omega$. Combining Equation (8a) and Equation (8b) for n=2, 3, ..., N-1 results in $$\zeta = Bn = h - G\alpha \quad (10)$$

where n is a noise vector with a covariance matrix $Q_n$ and determined according to n=$[e_{\alpha\beta}^T(0), e_{\alpha\beta}^T(1), \ldots, e_{\alpha\beta}^T(N-1)]^T$, the covariance matrix $Q_n$=diag($Q_{\alpha\beta}, Q_{\alpha\beta}, \ldots, Q_{\alpha\beta}$). $e_{\alpha\beta}(n)$ and $Q_{\alpha\beta} = TQT^T$, and Q is a covariance matrix of the noise.

A frequency matrix B, a first term vector h and a second term vector G are $$B = \begin{bmatrix} I & -2\alpha I & I & & \\ & I & -2\alpha I & I & \\ & & & \ddots & \\ & & I & -2\alpha I & I \end{bmatrix}_{2(N-2) \times 2N}, \quad (11)$$

$$h = \begin{bmatrix} v_\alpha(2) + v_\alpha(0) \\ v_\beta(2) + v_\beta(0) \\ \vdots \\ v_\alpha(N-1) + v_\alpha(N-3) \\ v_\beta(N-1) + v_\beta(N-3) \end{bmatrix}, \quad (12)$$

$$G = \begin{bmatrix} 2v_\alpha(1) \\ 2v_\beta(1) \\ \vdots \\ 2v_\alpha(N-2) \\ 2v_\beta(N-2) \end{bmatrix}, \quad (13)$$

where I is a 2×2 identity matrix, $\alpha$ represents an angular frequency $\omega$, $\alpha = \cos \omega$, N represents a number of the samples of the signal for a current period of time, wherein elements of the first term vector and the second term vector are functions of the samples of the signal, e.g., $v_\alpha(n)$ and $v_\beta(n)$ represent a sample of the signal at the instant of time n determined in $\alpha\beta$-reference domain, wherein n=0, 1, ..., N−1.

The Equation (10) is a linear equation with respect to a function of the angular frequency $\alpha$. One embodiment determines the frequency from the linear relationship, e.g., based on the linear equation (10) using a weighted least square (WLS) method.

The WLS method can determine the frequency $\hat{\alpha}_{N-1}$ at an instant of time corresponding to the sample N−1 according to $$\hat{\alpha}_{N-1} = (G^T W G)^{-1} G^T W h \quad (14)$$

A covariance of the frequency $\hat{\alpha}_{N-1}$ can be determined according to $$\text{cov}(\hat{\alpha}_{N-1}) = (G^T W G)^{-1} \quad (15)$$

where the weight matrix W is determined according to $$W = E[Bnn^T B^T]^{-1} = (B Q_n B^T)^{-1}, \quad (16)$$

wherein E represents an expected value of a function of the noise, T is a transpose operator, $Q_n$ is the covariance matrix of the noise vector.

Figure 5:
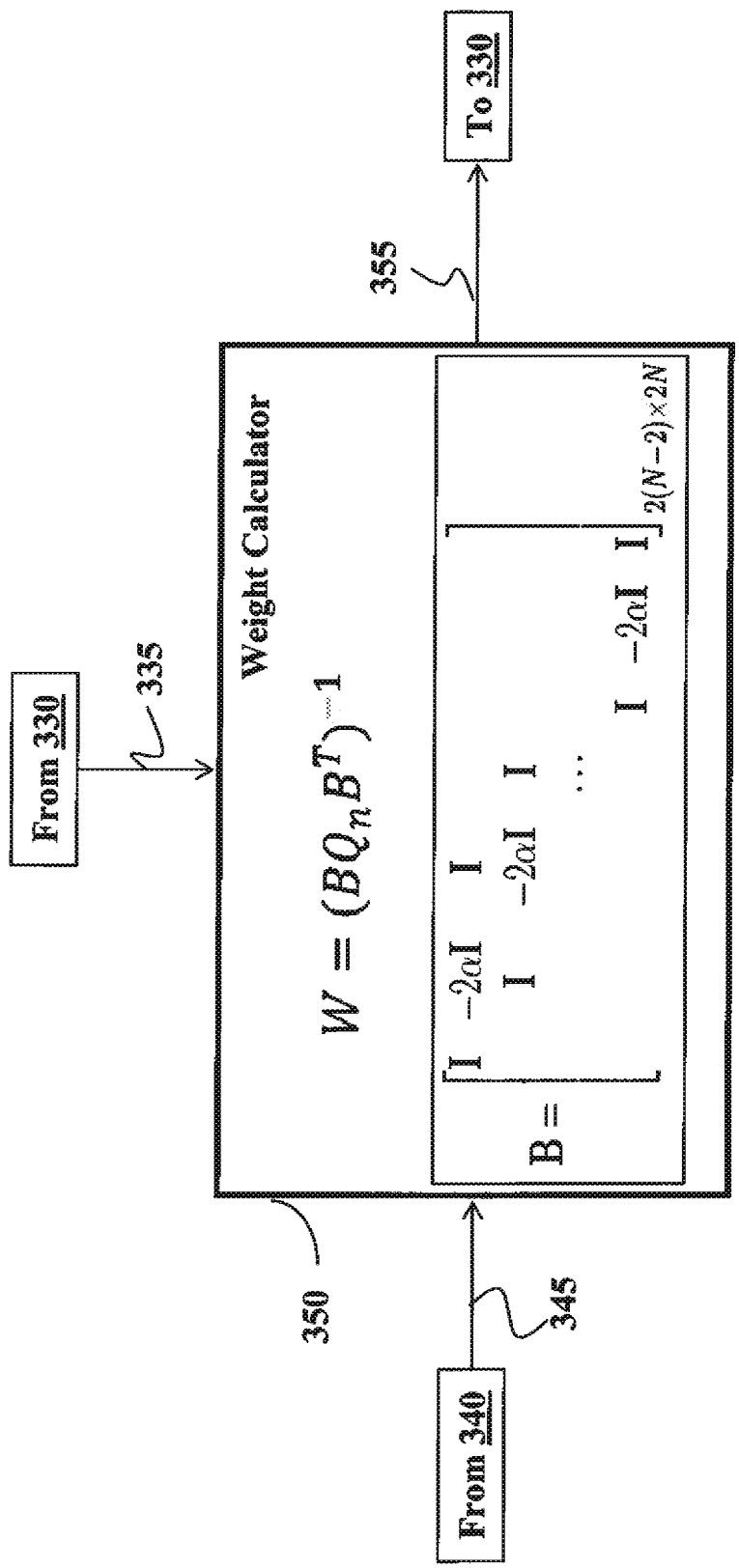
FIG. 5 is a block diagram of a method for updating the weights in a weight matrix in accordance with some embodiments of the invention.

As shown in FIG. 5, the weight calculator 350 updates the weights in the weight matrix W iteratively based on the statistical correlation of the noises and the parameters determined during the previous iteration.

The angular frequency at the time instant $\hat{\omega}_{N-1}$ is determined according to $$\hat{\omega}_{N-1} = \cos^{-1} \hat{\alpha}_{N-1} \quad (17)$$

The frequency of the signal $\hat{f}_{N-1}$ at the instant of time is determined according to $$\hat{f}_{N-1} = \frac{f_s}{2\pi} \hat{\omega}_{N-1}, \quad (18)$$

wherein $f_s$ is a sampling frequency.

Frequency and Angle of Phase

Figure 6:
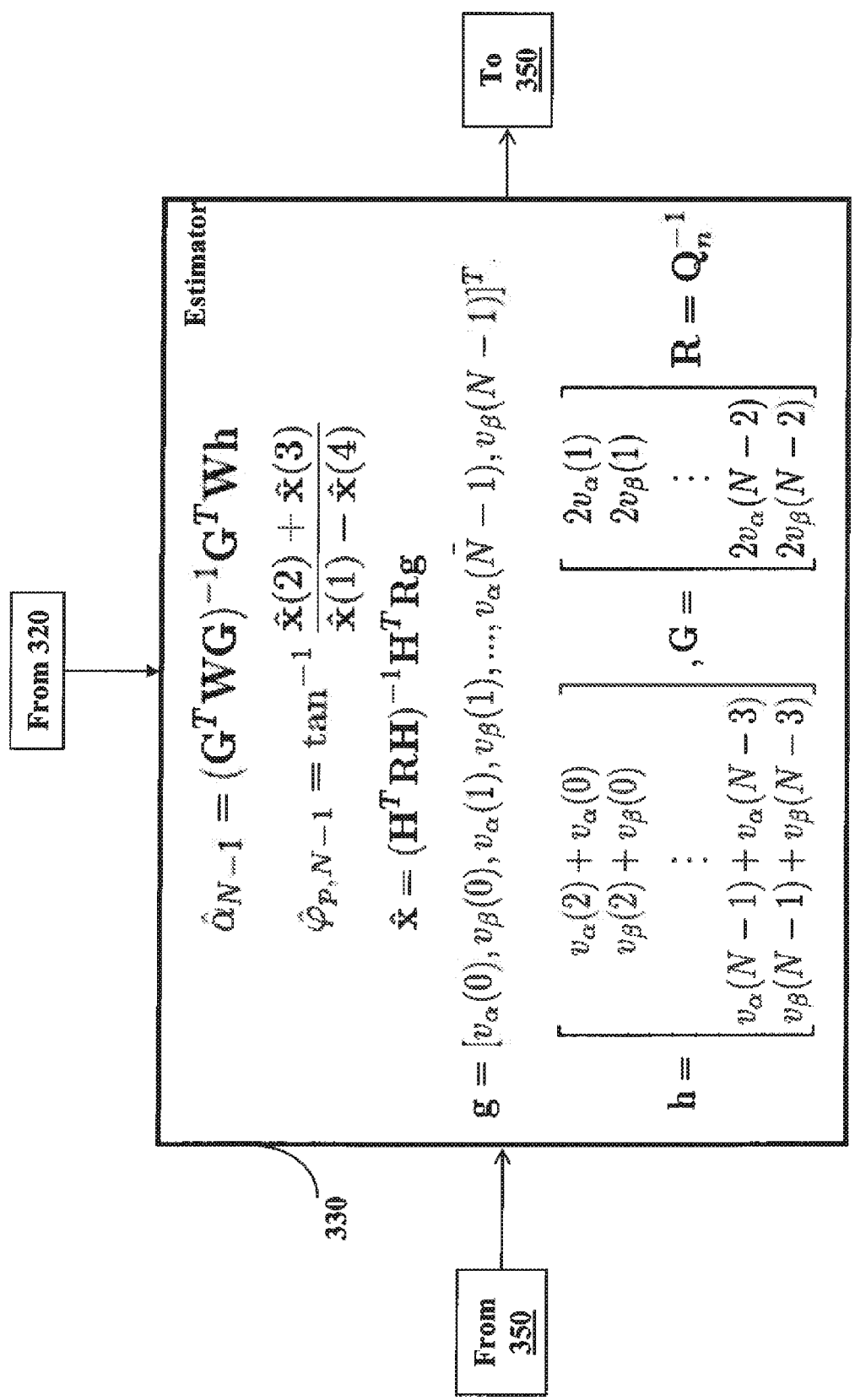
FIG. 6 is a block diagram of a method for determining the frequency and the angle of the phase in accordance with some embodiments of the invention.

FIG. 6 shows a block diagram of a method for determining the frequency and the angle of the phase in accordance with some embodiments of the invention.

Based on the frequency determined at the instant of time, the angle of the phase of the positive sequence is determined using another WLS method. The unknown vector x is defined according to $$x = \begin{bmatrix} V_p \cos\varphi_p + V_n \cos\varphi_n \\ V_p \sin\varphi_p - V_n \sin\varphi_n \\ V_p \sin\varphi_p + V_n \sin\varphi_n \\ -V_p \cos\varphi_p + V_n \cos\varphi_n \end{bmatrix}. \quad (19)$$

Based on the Equation (5), the linear equation with respect to x can be determined if the frequency $\omega$ is known. Replacing the frequency $\omega$ in Equation (5) with $\hat{\omega}_{N-1}$ and combining the equations for n=0, 1, ..., N−1 yield an approximated linear equation with respect to x according to $$n = g - Hx, \quad (20)$$

wherein a vector g is $$g = [v_\alpha(0), v_\beta(0), v_\alpha(1), v_\beta(1), \ldots, v_\alpha(N-1), v_\beta(N-1)]^T \quad (21)$$

and the 2nth and (2n+1)th rows of a matrix H, n=0, 1, ..., N−1, are $$\begin{bmatrix} \cos(n\hat{\omega}_{N-1}) & 0 & -\sin(n\hat{\omega}_{N-1}) & 0 \\ 0 & \cos(n\hat{\omega}_{N-1}) & 0 & -\sin(n\hat{\omega}_{N-1}) \end{bmatrix}. \quad (22)$$

The WLS solution to (20) is approximated according to $$\hat{x} = (H^T R H)^{-1} H^T R g, \quad (23)$$

wherein a weight matrix R is $$R = Q_n^{-1}. \quad (24)$$

After the approximation $\hat{x}$ is determined, the initial phase of positive sequence component can be identified based on the definition of the vector x in Equation (19) at the instant of time N−1 according to $$\hat{\varphi}_{p,N-1} = \tan^{-1} \frac{\hat{x}(2) + \hat{x}(3)}{\hat{x}(1) - \hat{x}(4)}. \quad (25)$$

The corresponding angle of the phase is determined according to $$\hat{\theta}_p(N-1) = (N-1)\hat{\omega}_{N-1} + \hat{\varphi}_{p,N-1}. \quad (26)$$

Some embodiments of the invention, initialize the frequency for the first iteration based on the fundamental frequency $\omega_o = 2\pi f_o / f_s$ of the three-phase voltage signal, which is usually known. Hence, $\alpha_o = \cos\omega_o$ can be used first to construct the weight matrix W. During the subsequent iterations, an estimate of $\omega$ is used to update the weight matrix W and then to update the frequency $\omega$.

EFFECT OF THE INVENTION

Some embodiments of the invention provides a method and a system for synchronizing and determining a phase angle of a three-phase voltage signals in a power grid in the presence of voltage unbalance. Both the amplitude and the phase unbalance are considered.

A new weighted least squares based synchronization method is provided to track the phase angle of the utility grid. Instead of processing the 3-phase voltage signal in the abc natural reference frame, one embodiment separates the positive and negative sequences in the transformed αβ reference domain.

Based on the obtained expressions in the αβ domain, the weighted least squares method estimates the angle of the phase of the positive sequence. Also, the angle of the phase of the negative sequence and the frequency are also determined. Some embodiments of the invention have a simpler structure and better accuracy, because the embodiments adjusts weight matrix iteratively based on the statistical correlation of the noise.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, minicomputer, or a tablet computer. Also, a computer may have one or more input and output devices. Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium or multiple computer readable media, e.g., a computer memory, compact discs (CD), optical discs, digital video disks (DVD), magnetic tapes, and flash memories. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above.

Computer-executable instructions may be in many forms, such as program modules, executed by one or more computers or other devices. Generally, program modules include routines, programs, objects, components, data structures that perform particular tasks or implement particular abstract data types. Typically the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for determining at least one parameter of a signal, using a suitably programmed processor, wherein the signal is a sinusoidal signal including noise, wherein the parameter includes at least one of a frequency of the signal at an instant of time, and an angle of a phase of the signal at the instant of time, comprising steps of:

producing, using a discrete oscillator, one or more discrete samples of the signal for each period of time; and determining iteratively the parameter of the signal based on a linear relationship among the frequency of the signal, samples of the noise, and the samples of the signal using a statistical correlation among the samples of the noise, wherein a current iteration includes:

updating the statistical correlation based on the frequency of the signal determined, during a previous iteration; and updating the samples of the signal with values of the signal during a current period of time.

2. The method of claim 1, further comprising:

initializing the statistical correlation based on a fundamental frequency of the signal.

3. The method of claim 1, further comprising:

determining the angle of the phase of the signal based on the frequency of the signal.

4. The method of claim 1, further comprising:

determining a weight matrix using the statistical correlation.

5. The method of claim 1, further comprising:

subjecting the signal to a discrete oscillator operation to produce the samples of the signal.

6. The method of claim 1, wherein the signal es a three-phase voltage signal, further comprising:

transforming the signal to a Clarke reference domain using a Clarke transformation.

7. The method of claim 1, wherein each iteration is performed for a period of time, and wherein at least some periods of time are overlapping.

8. The method of claim 1, wherein each iteration is performed for a period of time, and wherein the current period of time for the current iteration is adjacent to a previous period of time for the previous iteration.

9. The method of claim 1, wherein the linear relationship is defined according to $$\zeta = Bn = h - G\alpha,$$

wherein $\zeta$ represents an error due to the noise, n is a noise vector, B is a frequency matrix, h is a first term vector, G is a second term vector, a represents an angular frequency $\omega$, $\alpha = \cos\omega$, wherein elements of the first term vector and the second term vector are functions of the samples of the signal.

10. The method of claim 9, wherein the frequency matrix B is $$B = \begin{bmatrix} I & -2\alpha I & I & & & \\ & I & -2\alpha I & I & & \\ & & & \ldots & & \\ & & & I & -2\alpha I & I \end{bmatrix}_{2(N-2) \times 2N},$$

wherein I is an identity matrix N represents a number of the samples of the signal, wherein the first term vector h is $$h = \begin{bmatrix} v_\alpha(2) + v_\alpha(0) \\ v_\beta(2) + v_\beta(0) \\ \vdots \\ v_\alpha(N-1) + v_\alpha(N-3) \\ v_\beta(N-1) + v_\beta(N-3) \end{bmatrix},$$

wherein $v_\alpha(n)$ and $v_\beta(n)$ represent a sample of the signal at the instant of time n determined in $\alpha\beta$-reference domain, wherein n=0, 1, ..., N−1, and wherein the second term vector G is $$G = \begin{bmatrix} 2v_\alpha(1) \\ 2v_\beta(1) \\ \vdots \\ 2v_\alpha(N-2) \\ 2v_\beta(N-2) \end{bmatrix}.$$

11. The method of claim 10, further comprising:
determining the frequency from the linear relationship using a weighted least square (WLS) method.

12. The method of claim 11, further comprising:
determining the frequency a $\hat{\alpha}_{N-1}$ at an instant of time corresponding to sample N−1 according to $$\hat{\alpha}_{N-1} = (G^T W G)^{-1} G^T W h,$$

wherein a covariance of the frequency $\hat{\alpha}_{N-1}$ is determined according to $$cov(\hat{\alpha}_{N-1}) = (G^T W G)^{-1},$$

wherein a weight matrix W is determined according to $$W = E[Bnn^T B^T]^{-1} = (B Q_n B^T)^{-1},$$

wherein E represents an expected value of a function of the noise, T is a transpose operator, $Q_n$ is a covariance matrix of the noise vector; and
determining the frequency of the signal $\hat{f}_{N-1}$ at the instant of time according to $$\hat{f}_{N-1} = \frac{f_s}{2\pi} \hat{\omega}_{N-1},$$

wherein $f_s$ is a sampling frequency, and is the $\hat{\omega}_{N-1}$ angular frequency at the time instant, $\hat{\omega}_{N-1} = \cos^{-1} \hat{\alpha}_{N-1}$.

13. The method of claim 12, further comprising:
determining the angle of the phase based on the angular frequency $\hat{\omega}_{N-1}$.

14. The method of claim 13, further comprising:
determining the angle of the phase based on an approximated linear equation $$n = g - Hx,$$

wherein an unknown vector x is $$x = \begin{bmatrix} V_p \cos\varphi_p + V_n \cos\varphi_n \\ V_p \sin\varphi_p - V_n \sin\varphi_n \\ V_p \sin\varphi_p + V_n \sin\varphi_n \\ -V_p \cos\varphi_p + V_n \cos\varphi_n \end{bmatrix},$$

a vector g is $$g = [v_\alpha(0), v_\beta(0), v_\alpha(1), v_\beta(1), \ldots, v_\alpha(N-1), v_\beta(N-1)]^T,$$

a matrix is $$\begin{bmatrix} \cos(n\hat{\omega}_{N-1}) & 0 & -\sin(n\hat{\omega}_{N-1}) & 0 \\ 0 & \cos(n\hat{\omega}_{N-1}) & 0 & -\sin(n\hat{\omega}_{N-1}) \end{bmatrix},$$

wherein the unknown vector x is approximated according to $$\hat{x} = (H^T R H)^{-1} H^T R g,$$

wherein a weight matrix R is $$R = Q_n^{-1}.$$

15. The method of claim 14, wherein the determining the angle of the phase further comprises:
determining an initial phase $\hat{\varphi}_{p,N-1}$ of a positive sequence p of the signal according to $$\hat{\varphi}_{p,N-1} = \tan^{-1} \frac{\hat{x}(2) + \hat{x}(3)}{\hat{x}(1) - \hat{x}(4)};$$

and
determining the angle of the phase $\hat{\theta}_p(N-1)$ according to $$\hat{\theta}_p(N-1) = (N-1) \hat{\omega}_{N-1} + \hat{\varphi}_{p,N-1}.$$

16. A system for determining at least one parameter of a signal, wherein the signal is a three-phase voltage signal including noise, wherein the parameter includes at least one of a frequency of the signal at an instant of time, and an angle of a phase of the signal at the instant of time, comprising:
a discrete oscillator for producing one or more discrete samples of the signal for each period of time; and
a suitably programmed processor for determining iteratively', for each period of time, the frequency of the signal based on a linear relationship among the frequency of the signal, the noise, and the samples of the signal, wherein the processor during a current iteration updates a noise covariance matrix based on the frequency of the signal determined during a previous iteration;
updates the samples of the signal with values of the signal during a current period of time; and
determines the frequency using the noise covariance matrix and the samples of the signal.

17. The system of claim 16, wherein the processor is configured to determine the angle of the phase of the signal based on the frequency of the signal.

18. The system of claim 16, wherein the signal transformed into a Clarke reference domain.

19. The system of claim 16, wherein the processor updates the noise covariance matrix using a weighted least square (WLS) method.

20. The system of claim 6, wherein the linear relationship is defined according to $$\zeta = Bn = h = G\alpha,$$

wherein $\zeta$ represents an error due to the noise, n is a noise vector. B is a frequency matrix, h is a first term vector, G is a second term vector, $\alpha$ represents an angular frequency $\omega$, $\alpha = \cos \omega$, wherein elements of the first term vector and the second term vector are functions of the samples of the signal.

* * * * *